United States Patent
Kumei et al.

(10) Patent No.: US 8,373,185 B2
(45) Date of Patent: Feb. 12, 2013

(54) LIGHT EMITTING DEVICE INCLUDING RESIN AND MANUFACTURING METHOD FOR THE SAME

(75) Inventors: Masami Kumei, Tokyo (JP); Soji Owada, Tokyo (JP); Koichi Takayama, Tokyo (JP); Mitsunori Harada, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 322 days.

(21) Appl. No.: 12/637,750

(22) Filed: Dec. 15, 2009

(65) Prior Publication Data

US 2010/0155758 A1    Jun. 24, 2010

(30) Foreign Application Priority Data

Dec. 18, 2008 (JP) .................. 2008-322760

(51) Int. Cl.
*H01L 33/00* (2010.01)
(52) U.S. Cl. ............. 257/98; 257/E33.059; 438/26
(58) Field of Classification Search ............ 257/98, 257/E33.059–E33.061
See application file for complete search history.

(56) References Cited

U.S. PATENT DOCUMENTS

| | | | |
|---|---|---|---|
| 2002/0022681 A1* | 2/2002 | Ichiroku et al. | 524/261 |
| 2006/0081814 A1* | 4/2006 | Shida et al. | 252/301.4 F |
| 2006/0243996 A1* | 11/2006 | Ueda et al. | 257/98 |
| 2009/0008673 A1 | 1/2009 | Kato et al. | |

FOREIGN PATENT DOCUMENTS

| | | |
|---|---|---|
| JP | 2005-109434 A | 4/2005 |
| JP | 2007-19459 A | 1/2007 |
| JP | 2007-269999 A | 10/2007 |
| JP | 2007-308345 A | 11/2007 |

\* cited by examiner

*Primary Examiner* — Ha Tran T Nguyen
*Assistant Examiner* — Raj R Gupta
(74) *Attorney, Agent, or Firm* — Kenealy Vaidya LLP

(57) ABSTRACT

A light emitting device is provided, including a resin which can be manufactured according to a simple process and deliver a desired scattering property. The light emitting device is manufactured according to a step for mixing two or more types of immiscible liquid materials to obtain a composition containing at least two types of materials phase-separated in a sea-island structure, and a step for arranging the composition in proximity to an LED chip, curing the composition with the sea-island structure being maintained, thereby forming an encapsulation resin. Accordingly, it is possible to form an island region which serves as a scattering center, according to a simple step of mixing materials.

1 Claim, 5 Drawing Sheets

IMAGE SCALING UNIT : μm (KF351 0%, 7%, 11%, 13% FROM THE LEFT)

↑
Comparative
Example

LIGHT EMITTING DEVICE INCLUDING RESIN AND MANUFACTURING METHOD FOR THE SAME

FIELD OF THE INVENTION

The present invention relates to a light emitting device provided with a resin part which causes a scattering of light from a light emitting element.

DESCRIPTION OF THE RELATED ART

By way of example, there is known a light-emitting element which encapsulates an LED chip in a transparent resin so as to enhance efficiency in retrieving light from the LED chip, as described in the Japanese Unexamined Patent Application Publication No. 2007-308345 (hereinafter, referred to as "patent document 1") and the like. It is disclosed that in the structure above, crystalline grains of metal oxide are dispersed in the transparent resin, thereby increasing the refractive index of the transparent resin, while keeping strength of the resin, and accordingly, the light retrieval efficiency is enhanced and light scattering properties are delivered as well.

The Japanese Unexamined Patent Application Publication No. 2007-269999 (hereinafter, referred to as "patent document 2") discloses a resin composition in which polymer particles are dispersed, in order to provide an optical resin which has superior heat resistance, light resistance, and toughness.

On the other hand, the Japanese Unexamined Patent Application Publications No. 2005-109434, No. 2007-019459 (hereinafter, referred to as "patent document 3" and "patent document 4"), and the like, disclose a light emitting element obtained by adding phosphor particles in a resin layer which encapsulates an LED chip. The phosphor absorbs a part of light emitted from the LED chip, being excited, and then emits fluorescence. By way of example, as described in the patent document 3, it is configured such that the LED chip emits blue light and the phosphor emits yellow-orange colored fluorescence being a complementary color of the blue color, whereby a light emitting device which emits white light is achieved, the white color being obtained by mixing the blue light and the yellow-orange colored fluorescence.

The patent document 4 describes that inorganic oxide particles are added in a resin containing the phosphor, thereby enhancing optical properties and workability. By a way of example, in the case where a silica particle has a particle diameter of approximately 10 nm, a high viscosity control effect is produced, and on the other hand, if the silica particle diameter is a few micrometers, it is possible to obtain an effect of suppressing cracks and contraction. It is further described that a scattering effect is enhanced when inorganic oxide particles each being approximately 1 μm in particle diameter are added, and another effect of refraction index improvement is provided by adding particles being 3 to 5 nm in particle diameter whose refraction index is high. The document also describes that it is possible to use those kinds of particles in combination.

In the techniques described in the patent documents 1 to 4 where particles are dispersed in a resin, it is necessary to prepare in advance particles being tiny in diameter, made of an inorganic material or an organic material, and it may cause a more complicated manufacturing process and drive up costs.

There is another problem that when fine particles are dispersed in the resin as described in the patent documents 1 to 4, following situations may be found; coagulation of fine particles resulting in formation of secondary particles, inhomogeneous dispersion of the fine particles, or occurrence of sedimentation. In such instances above, there is a possibility that a desired optical property is not obtained, and further, a desired heat resistance and resin strength may not be obtained either.

If the fine particles of inorganic material are added as disclosed in the patent documents 1, 3, and 4, Young's modulus of an encapsulation resin becomes higher along with the increase of contained amount of the fine particles of inorganic material, and consequently separation and/or cracks may occur. In addition, there is a possibility that thermal expansion caused by heat shock may break a feed wire.

An object of the present invention is to provide a light emitting device including a resin which is able to be manufactured according to a simple process and deliver a desired scattering property.

SUMMARY OF THE INVENTION

In order to achieve the above object, the present invention provides a light emitting device including a light emitting element, and a resin part arranged at a position which light emitted from the light emitting element passes through, wherein the resin part has a configuration including a sea-island structure formed by mixing two or more types of materials being immiscible. Since the sea-island structure is formed in this manner, light is scattered on the interface between a sea part and an island part. Therefore, it is possible to deliver a scattering property even if an encapsulant is manufactured according to a simple process.

It is preferable that the island part of the sea-island structure is formed to be granular so as to enhance the light scattering property. It is desirable that a material for the sea part of the sea-island structure is selected in such a manner that a refraction index is different between the sea part and the island part. It is preferable that the diameter of the island part of the sea-island structure is between or equal to 0.01 μm and 100 μm.

Both of the sea part and the island part of the sea-island structure may be made of a polymer material. By way of example, it is preferable that both of the polymer materials which constitute the sea part and the island part respectively are silicone resin, because the silicone resin is able to enhance durability. One of the silicone resins constituting the sea part and the island part respectively is allowed to introduce a hydrocarbon group into the side chain, thereby establishing immiscibility.

It is further possible to constitute the sea part and the island part using materials, in such a manner that one polymer material is silicone resin and the other polymer material is silicone oil.

Either of the resin constituting the sea part and the polymer material constituting the island part serves as a base resin, and a curing agent to cure the base resin can be used as the other. Accordingly, it is possible to easily form an encapsulant made of resin as a whole.

It is further possible to disperse phosphors in the resin part, the phosphors being excited by the light from the light emitting element and emitting fluorescence. With this configuration, a resin part having a color transformation function is provided.

It is preferable that both materials constituting the sea part and the island part of the sea-island structure are transparent against visible light. This is because transmittance can be maintained, while delivering the scattering property.

It is also possible to use the resin part as an encapsulation resin for sealing the light emitting element.

According to the present invention, a manufacturing method for the light emitting device is provided as the following. In other words, this is a method for manufacturing a light emitting device including a step for mixing two or more types of immiscible liquid materials to obtain a composition containing at least two types of materials phase-separated in a sea-island structure, and a step for arranging the composition in proximity to an LED chip, curing the composition with the sea-island structure being maintained, thereby forming an encapsulation resin.

By way of example, a base resin and a curing agent for curing the base resin may be employed as the two types of immiscible liquid materials.

It is preferable to employ silicone resin materials for both of the two types of immiscible liquid materials, because such materials may enhance the durability of the light emitting device. One of the silicone resin materials of the two types of immiscible materials is allowed to introduce hydrocarbon-based substituent in the side chain, thereby facilitating establishment of immiscibility.

Silicone resin material and silicone oil may be employed as the two types of immiscible liquid materials.

It is preferable that the refraction index is different between the resin of the sea part and the resin of the island part of the sea-island structure after the curing.

It is preferable that the diameter of the island part of the sea-island structure after the curing is between or equal to 0.01 μm and 100 μm.

According to the present invention, it is possible to provide a light emitting device which is manufactured in a simple process of mixing two materials, and which includes a resin delivering a desired scattering property.

BRIEF DESCRIPTION OF THE OF DRAWINGS

DESCRIPTION OF THE PREFERRED EMBODIMENT

One embodiment of the present invention will be explained.

Figure 1:
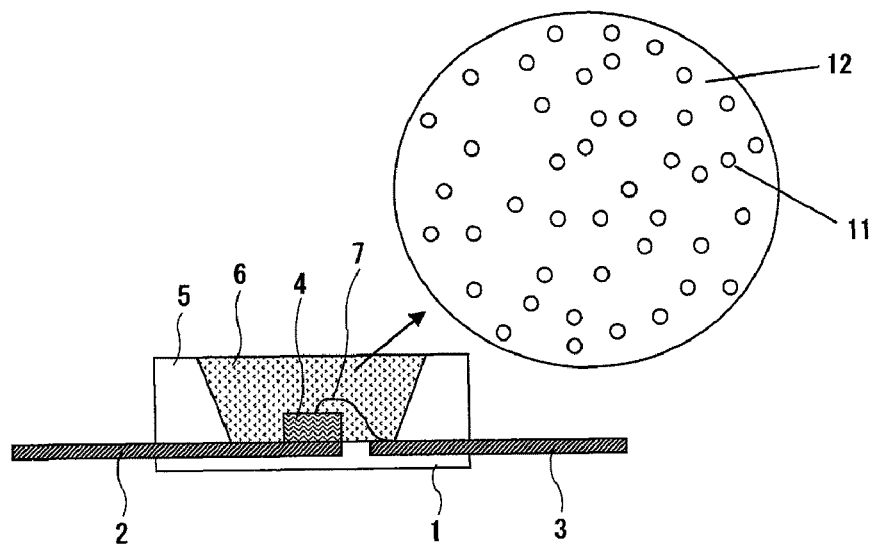
FIG. 1 illustrates a sectional view of a white LED device and an enlarged explanatory view of the encapsulant 6 according to an embodiment of the present invention.

With reference to FIG. 1, the light emitting device according to the present embodiment will be explained.

As shown in FIG. 1, an LED chip 4 is mounted on a substrate 1 on which electrodes 2 and 3 are formed in advance. Die-bonding of a back-surface electrode of the LED chip 4 is performed on the electrode 2, and an upper surface electrode is connected to the electrode 3 via a bonding wire 7. A package 5 is placed around the light emitting element 4. The package 5 is filled with an encapsulant 6 to seal the light emitting element 4.

The encapsulant 6 is made of a resin composition having a sea-island structure, and this structure provides a light scattering property. The sea-island structure is formed by a phase-separating operation between two types of immiscible materials. In other words, one compositional region (sea) 12 surrounds the other compositional region (island) 11, thereby forming a domain-like structure. It is to be noted that FIG. 1 illustrates an enlarged view of the encapsulant 6, and the island region 11 is represented by a circular shape for ease of explanation. However, the outer shape of the island region 11 is not limited to the shape as shown in FIG. 11, and any other shape is applicable. In order to deliver the light scattering property effectively, it is preferable that the island region 11 is formed to be granular. Since immiscible materials are mixed to form the structure above, a globular shape or ellipsoidal shape may be easily employed as the island region 11.

It is desirable that the materials which constitute the sea region 12 and the island region 11 respectively are transparent against the light emitted from the LED chip 4, because this configuration allows provision of scattering property without deteriorating the transmittance.

It is necessary that the encapsulant 6 has a certain shape and is provided with a predetermined hardness so as to fulfill a function to seal the LED chip 4. Therefore, it is desirable that polymers, that is, a resin in particular, constitutes at least the sea region 12. A material constituting the island region 11 may be monomers or oligomers, but polymers, that is, a resin in particular, is more preferable. At the time of mixing, each degree of polymerization (molecular weight) of the two immiscible materials may be in the state of low-molecular (monomers), oligomers, polymers, or a combination thereof.

A material constituting the sea region 12 may be a hydrocarbon-based resin, such as acrylic-based resin, epoxy-based resin, and imide-based resin, or a silicone resin. A material constituting the island region 11 may be a hydrocarbon-based resin, such as acrylic-based resin, epoxy-based resin, and imide-based resin, or a silicone resin. Typically, the hydrocarbon-based resin material and the silicone resin material are immiscible, and therefore, by using materials selected from each, it is possible to obtain a resin having the sea-island structure.

It is further possible to employ silicone oil as a material to constitute the island region 11.

On the other hand, the silicone-based resin has an advantage in durability against heat and light. Therefore, it is desirable to allow both the sea region 12 and the island region 11 to be made of the silicone resin, and enhance the durability of the LED light emitting device. In the case above, as one of the silicone resin materials, a resin material in which hydrocarbon-based substituent is introduced in the side chain is employed, thereby generating the immiscibility against the silicone resin in which the hydrocarbon-based substituent is not introduced. Accordingly, the two silicone resin materials are mixed to form the sea-island structure, and the overall sea-island structure is made of the silicone resin, achieving the encapsulant being excellent in durability.

A material operating as a base resin and another material for curing the base resin can be employed respectively, as the resin material which constitutes the sea region 12 and the resin material which constitutes the island region 11. Accordingly, curing of two types of resin materials is possible simultaneously with forming the sea-island structure, and therefore the encapsulant 6 having the sea-island structure can be made in a simple process.

The two types of immiscible materials to be mixed are not limited to the example where one is a resin material acting as a base resin and the other is a resin material acting as a curing agent. For example, it is further possible to obtain a material composition having the sea-island structure, by mixing a third immiscible material into the mixed composition which is obtained by mixing the base resin and the curing agent being miscible. By way of example, resin materials such as silicone-based resin are used as the base resin and the curing agent, and silicone oil can be employed as the third material.

A material of the resin for constituting the sea region 12 of the encapsulant 6 is selected in such a manner that the refraction index thereof is different from the material which constitutes the island region 11 for delivering light scattering property. It is preferable that the diameter of the island part of the sea-island structure is between and equal to 0.01 μm and 100 μm.

In the light emitting device having such configuration as described above, the light emitted from the LED chip 4 passes through the encapsulant 6, and emitted to the outside. Upon passing through the encapsulant 6, the light proceeds on the interface between the sea region 12 and the island region 11, while changing the direction of travel. Therefore, the light is diffused, thereby reducing unevenness on a luminous surface. In other words, since the sea-island structure of the encapsulant 6 produces diffuseness, it is not necessary to follow a conventional manner that fine particles are prepared separately and subsequently added.

An explanation will be made regarding a manufacturing method for the light emitting device according to the present embodiment.

The substrate 1, on which the electrodes 2 and 3 are formed, is prepared and die-bonding of the LED chip 4 onto the electrode 2 is performed. Wire-bonding of both ends of the wire 7 respectively onto the upper surface electrode of the LED chip 4 and the electrode 3 are performed, thereby establishing connection therebetween. The package 5 is fixed around the LED chip 4.

Next, two types of immiscible materials, being selected in advance, are mixed. By way of example, a resin material acting as a base resin and a resin material acting as a curing agent are mixed. Immiscibility between those resin materials may cause a phase separation therebetween, and a material composition having a sea-island structure is formed in such a manner that one resin material forms the sea region and the other resin material forms the island region. The space around the LED chip 4 surrounded by the package 5 is filled with the material composition being obtained. Next, a predetermined curing process is applied, such as application of heat and UV light irradiation, and the resin is cured in the state where the sea-island structure of the material composition is maintained, thereby forming the encapsulant 6 which has the sea-island structure.

With the procedure above, even though the process is simple, such as just mixing two types of materials, it is possible to obtain the encapsulant 6 having the light scattering property. Accordingly, the light emitted from the LED chip 4 is diffused by the encapsulant 6, thereby achieving a light emitting device with less unevenness in brightness and luminance, between the central part and the peripheral part on the luminous surface.

As far as the resin materials of the encapsulant 6 satisfy the condition that the materials are immiscible upon mixing, the sea-island structure can be formed easily according to phase separation. It is further possible to form the island region 11 homogeneously just by mixing, unlike the case of using fine particles which may cause uneven dispersion. In addition, since the island region 11 does not form secondary particles unlike the case of using fine particles, it is possible to produce the island region 11, each having a uniform diameter. Therefore, the encapsulant 6 having a uniform scattering property can be manufactured according to a simple process. Adjustment of the amount of two types of immiscible materials to be mixed allows relatively easy adjustment of the amount of the island region 11.

In the present embodiment, the encapsulant 6 can be formed in a simple process which is just a mixture of materials. Therefore, there is a high degree of flexibility in selecting a material, when compared with the encapsulant in which fine particles prepared in advance in a separate process are mixed in a binder resin. Therefore, it is possible to select materials respectively having thermal expansion coefficients close to each other, allowing the wire 7 to be impervious to a break due to thermal expansion at the time of heat shock. Even when the volume of the island region 11 is increased, which serves as scattering center, the Young's modulus hardly becomes higher, and separation and/or cracks hardly occur.

Figure 2:
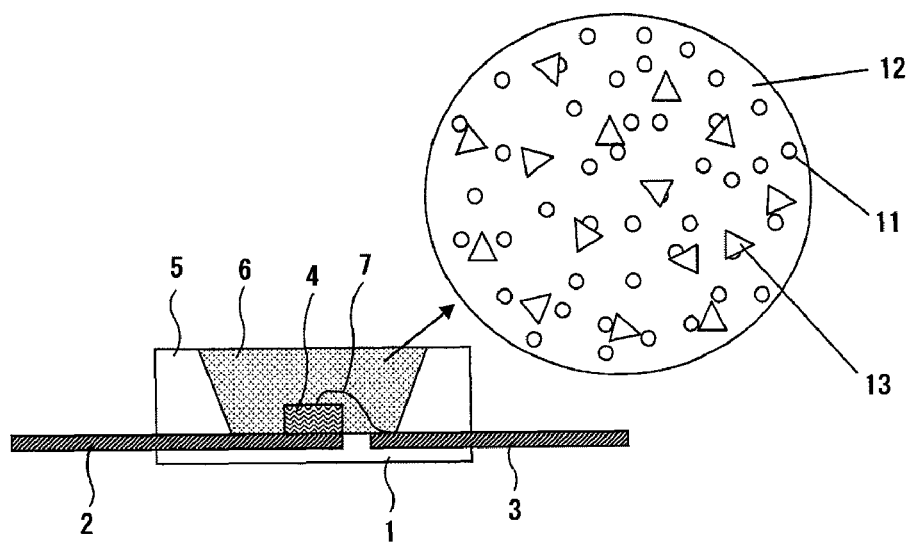
FIG. 2 illustrates a sectional view of the white LED device and an enlarged explanatory view of the encapsulant 6 in which phosphor particles 13 are dispersed according to an embodiment of the present invention.

As shown in FIG. 2, it is also possible to disperse phosphor particles 13, which are excited by the light from the LED chip 4 and emit fluorescence. FIG. 2 illustrates an enlarged view of the encapsulant 6, and for the ease of illustration, the island region 11 is represented by a circular shape and the phosphor particle 13 is represented by a triangular shape. However, the island region 11 and the phosphor particle 13 may have any outer shapes. In the light emitting element in the structure as shown in FIG. 2, a part or all of the light emitted from the LED chip 4 is converted into light (fluorescence) having different wavelengths. Therefore, it is possible that the color of the light emitted from the light emitting device is made different from the light emitted from the LED chip 4. In the case above, the encapsulant 6 has a light diffusion performance delivered by the sea-island structure as described above, and therefore homogeneous brightness and chromaticity can be obtained.

When the phosphor particles 13 are dispersed in the encapsulant 6, it is desirable that the materials constituting the island region 11 and the sea region 12 of the encapsulant 6 are transparent not only against the light emitted from the LED chip 4, but also against the fluorescence of the phosphor particles 13.

The light emitting device according to the present embodiment is applicable to an LED lamp, an office-use/home-use lighting system, a store lighting system, a public outdoor lighting system, automobile/train/aircraft use lighting system, and a light-source system used for information equipment such as a TV/cell-phone.

EXAMPLES

A light emitting device as shown in FIG. 1 was produced according to one embodiment of the present invention.

Example 1

In the example 1, an encapsulant 6 was formed by mixing two types of immiscible resin materials (base resin and curing agent).

Firstly, the substrate 1 on which the electrodes 2 and 3 were formed was prepared, and die-bonding of the LED chip 4 onto the electrode 2 was performed. Wire-bonding of both ends of the wire 7 respectively onto the upper surface electrode of the LED chip 4 and the electrode 3 was performed, thereby establishing connection therebetween. The package 5 was fixed around the LED chip 4.

Next, 0.3759 g of polystyrene (a product of Sigma-Aldrich Japan Co.) as a base resin, 0.25 g of U-6LPA (a product of Shin-Nakamura Chemical Co., Ltd.) and 0.0625 g of APT022 (a product of Shin-Nakamura Chemical Co., Ltd.) as curing agents, and 0.0156 g of Darocur 1173 (a product of Chiba Specialty Chemicals K. K.) as a polymerization initiator were dissolved into 25 ml of THF (tetrahydrofuran).

Coating of the resin material composition being obtained was applied to the LED chip 4, and a coated film was formed by evaporating a solvent at a room temperature. After heating at 120° C. for two minutes, UV rays were irradiated on the coated film, thereby curing the film.

Figure 3:
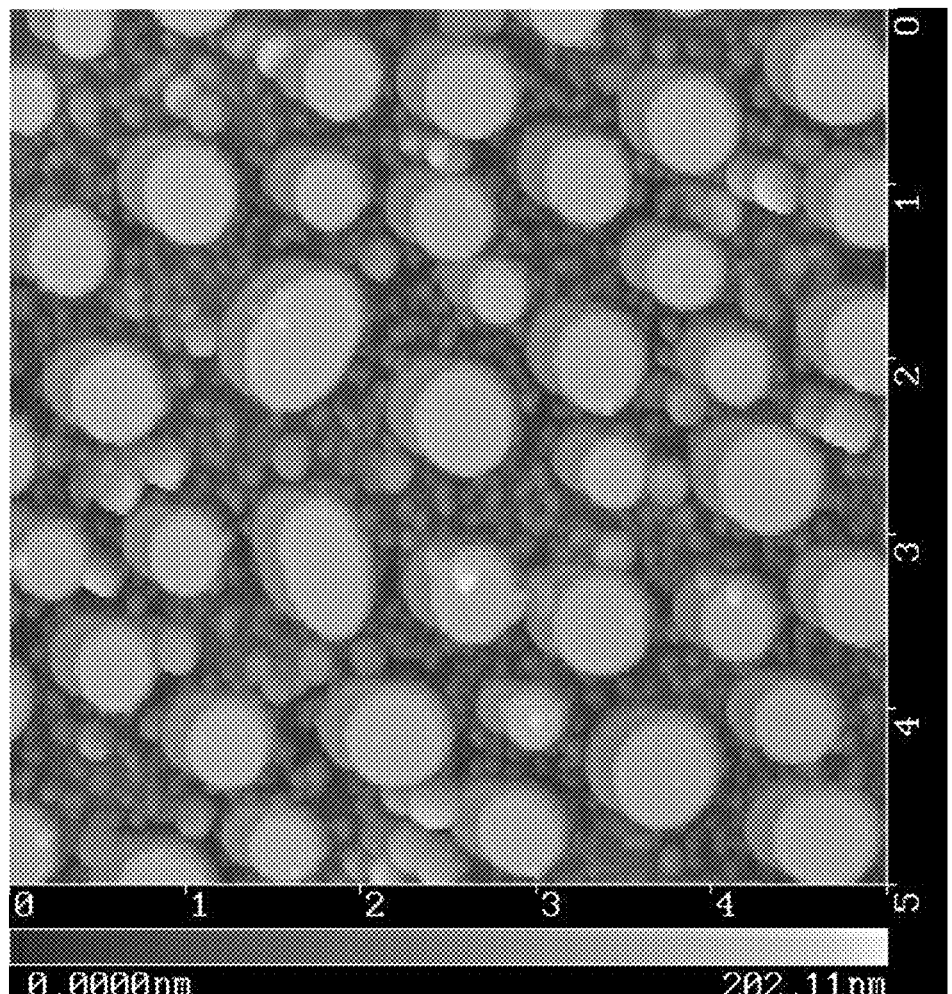
FIG. 3 shows an AFM image of the encapsulation resin of the example 1.

The obtained film showed white turbidity, and delivered a light diffusion property. When a surface of the obtained film was observed by an AFM (atom force microscope), it was found that there was a domain structure (sea-island structure) as shown in FIG. 3.

Example 2

In the example 2, a resin material composition was obtained by mixing silicone oil in a silicone resin, and the light emitting device as shown in FIG. 2 was produced.

To obtain the resin material composition, silicone resin OE6665A, B (a product of Dow Corning Toray Co., Ltd.) and 8% of silicone oil KF351 (a product of Shin-Etsu Chemical Co., Ltd.) were mixed. In here, 8 wt % of YAG-based phosphor particles were mixed as the phosphor particles 13. An LED chip which emits blue light was employed as the LED chip 4.

Coating of the resin material composition being obtained was applied to the LED chip 4, and a coated film was formed by evaporating the solvent at a room temperature. After heating at 150° C. for sixty minutes, UV rays were irradiated on the coated film, thereby curing the film. Other steps were carried out in the same manner as the example 1.

The resin material compositions as observation samples were obtained by varying the mixed quantity of the silicone oil KF351 to 7%, 11%, and 13%, and coating of these samples were applied on a slide glass and then cured. In the observation samples, phosphor particles 13 were not added.

As a comparative example, KF351 was not mixed and the silicone resin OE6665A, B was used as the resin material composition, with the phosphor particles 13 being added, and the light emitting device of a comparative example having the structure as shown in FIG. 2 was produced. Furthermore, an observation sample as a comparative example was produced, using the resin material composition in which the phosphor particles 13 were not added.

Figure 4:
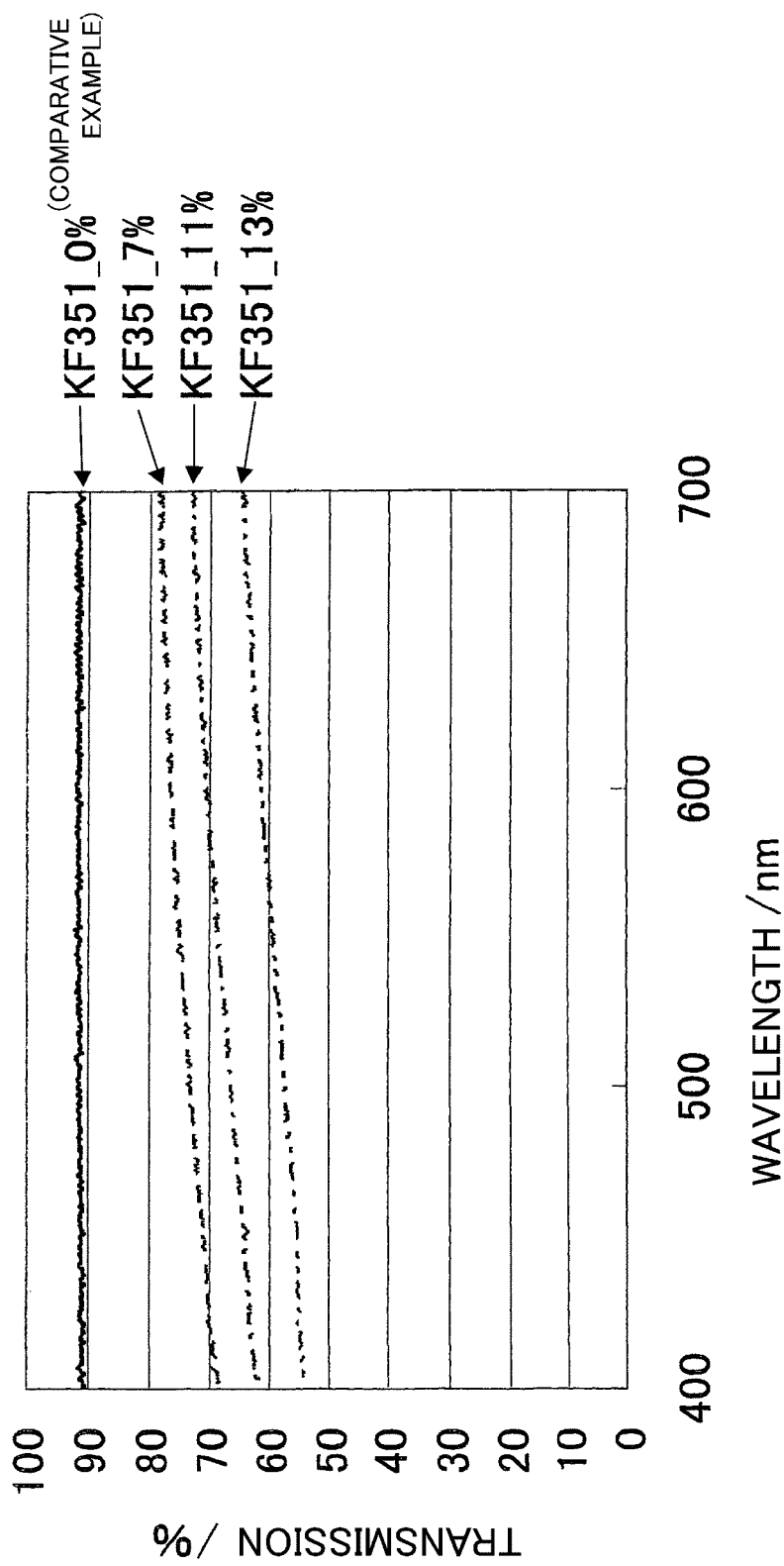
FIG. 4 is a graph showing the change of transmission depending on the irradiated light wavelength, as to each observation sample of the encapsulant obtained in the example 2.
Figure 5:
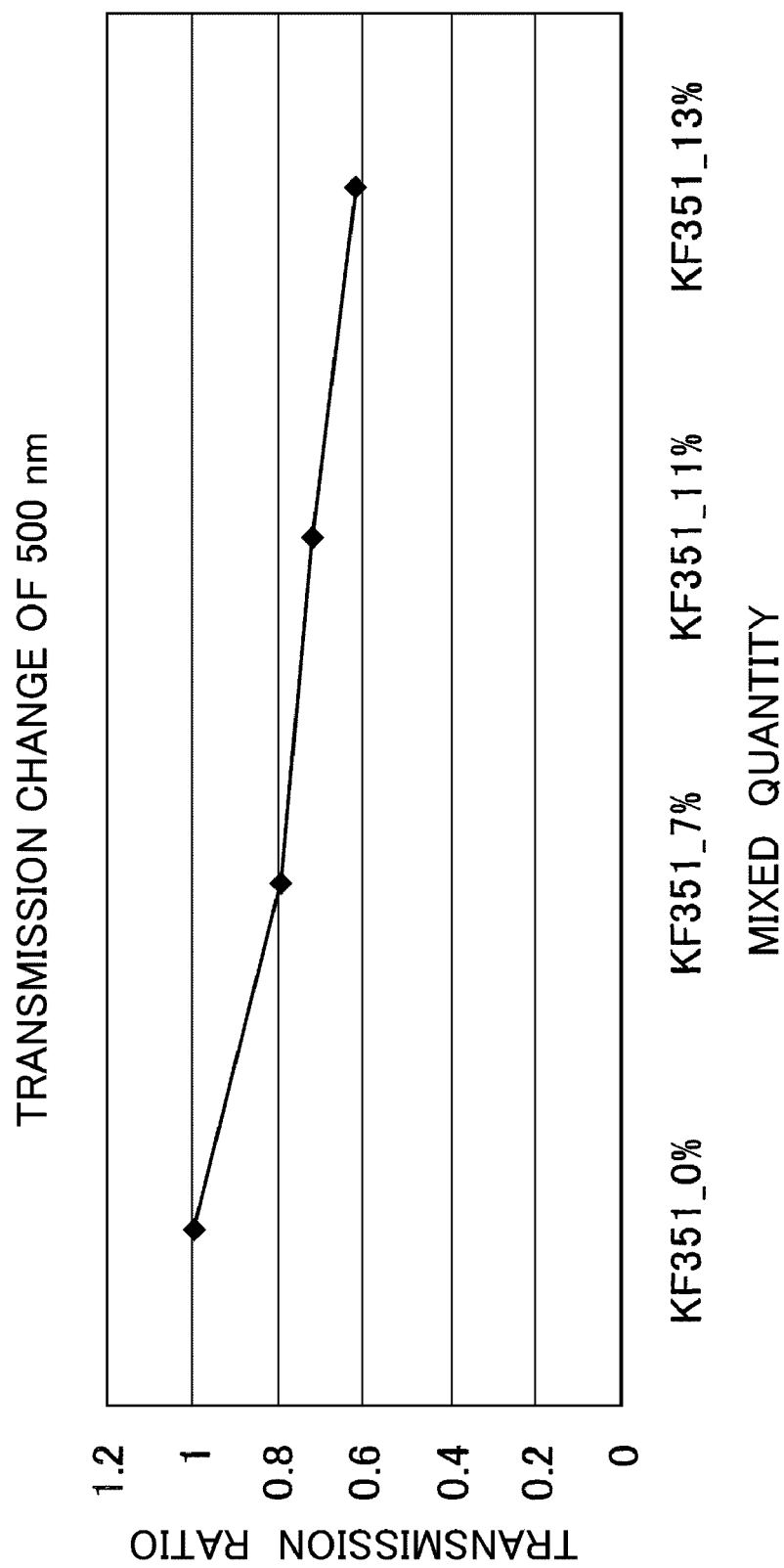
FIG. 5 is a graph showing the change of transmission depending on the mixed quantity of silicone oil, as to each observation sample of the encapsulant obtained in the example 2.
Figure 6:
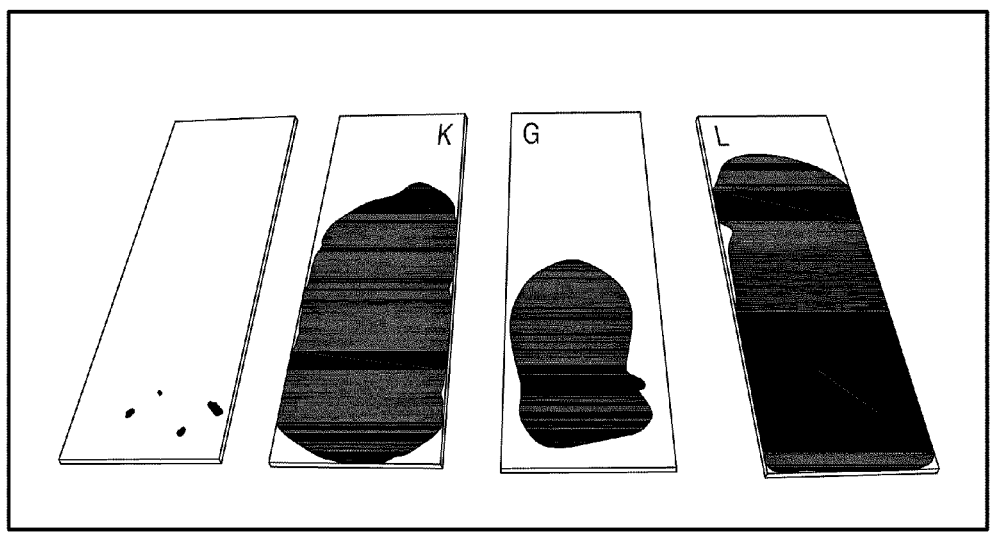
FIG. 6 is a photograph of each observation sample of the encapsulant of the example 2.

Transmission of light of wavelengths from 400 to 700 nm was measured as to each of the observation samples of the example 2; mixed quantity of the silicone oil KF351 being 7%, 11%, and 13%, respectively, and the observation sample of the comparative example. FIG. 4 and FIG. 5 illustrate the results of the measurement. It is found that the transmission of the observation samples of the example 2 became higher as the wavelength of the irradiated light became longer, the transmission became lower as the mixed quantity of the silicone oil increased and therefore the light was diffused more. As shown in FIG. 6, it is confirmed that the light diffusion showed white turbidity in the appearance of resin in the observation samples.

Light was emitted from the light emitting device according to the example 2, which was produced by using the resin material composition with 8% of mixed quantity of the silicone oil KF351, and light was also emitted from the light emitting device according to the comparative example. Then, each of the chromaticity was measured. These light emitting devices changed a part of blue light emitted from the LED chip 4 to yellow-orange light by the phosphor particles 13, and outputted white light which was obtained by mixing the blue light and the yellow light. Table 1 illustrates the result of the chromaticity measurement. It is confirmed that the light emitting device of the example 2 showed less variations in color on the luminous surface, in comparison to the light emitting device of the comparative example.

TABLE 1

|  | Chromaticity (x) | |
| --- | --- | --- |
|  | Standard Deviation | Max-Min |
| Light emitting element of LED in Example 2 (Phase-separated encapsulation resin) | 0.001645 | 0.01235 |
| Light emitting element of LED in Comparative Example (Non phase-separated encapsulation resin) | 0.001884 | 0.01392 |

What is claimed is:

1. A light emitting device comprising a light emitting element and a resin part arranged at a position where light emitted from the light emitting element passes through, wherein,
    the resin part comprises a sea-island structure which is formed by mixing two or more types of immiscible materials, and
    each of a sea part and an island part of the sea-island structure is made of a polymer material wherein,
    one of the sea part and the island part contains a base resin, and the other of the sea part and the island part contains a curing agent that cures the base resin.

* * * * *